United States Patent
Fehrer et al.

(10) Patent No.: US 7,446,344 B2
(45) Date of Patent: Nov. 4, 2008

(54) RADIATION-EMITTING SEMICONDUCTOR CHIP, METHOD FOR PRODUCTION THEREOF AND RADIATION-EMITTING COMPONENT

(75) Inventors: Michael Fehrer, Bad Abbach (DE); Volker Harle, Waldetzenberg (DE); Frank Kuhn, Munich (DE); Ulrich Zehnder, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 239 days.

(21) Appl. No.: 10/491,304

(22) PCT Filed: Sep. 27, 2002

(86) PCT No.: PCT/DE02/03668

§ 371 (c)(1),
(2), (4) Date: Sep. 9, 2004

(87) PCT Pub. No.: WO03/030271

PCT Pub. Date: Apr. 10, 2003

(65) Prior Publication Data

US 2005/0017258 A1    Jan. 27, 2005

(30) Foreign Application Priority Data

Sep. 28, 2001   (DE) ................................ 101 48 227

(51) Int. Cl.
*H01L 33/00* (2006.01)
(52) U.S. Cl. .................... 257/95; 257/98; 257/E33.067; 257/E33.07
(58) Field of Classification Search ............ 257/91, 257/95, 98, E33.067, E33.07
See application file for complete search history.

(56) References Cited

U.S. PATENT DOCUMENTS 4,094,752 A    6/1978   Vahe (Continued)

FOREIGN PATENT DOCUMENTS

DE            25 54 029        12/1987

(Continued)

OTHER PUBLICATIONS

Song, J.L. et al., "Efficiency improvement in Light-Emitting Diodes Based on Geometrically Deformed Chips", pp. 237-248, SPIE Conference on Light-Emitting Diodes, San Jose, CA, Jan. 1999.

*Primary Examiner*—Minh-Loan T Tran
(74) *Attorney, Agent, or Firm*—Cohen Pontani Lieberman & Pavane LLP

(57) ABSTRACT

A radiation-emitting semiconductor chip, having a multilayer structure (100) containing a radiation-emitting active layer (10), and having a window layer (20), which is transmissive to a radiation emitted by the active layer (10) and is arranged downstream of the multilayer structure (100) in the direction of a main radiating direction of the semiconductor component. The window layer (20) has at least one peripheral side area (21), which, in the course from a first main area (22) facing the multilayer structure (100) in the direction toward a second main area (23) remote from the multilayer structure (100), firstly has a first side area region (24) which is beveled, curved or stepped in such a way that the window layer widens with respect to the size of the first main area (22). A peripheral side area (11) of the multilayer structure (100) and at least a part of the beveled, curved or stepped first side area region (24) are coated with a continuous electrically insulating layer (30). A radiation-emitting component is disclosed having a chip of this type, and also disclosed is a method for simultaneously producing a multiplicity of such chips.

19 Claims, 7 Drawing Sheets

U.S. PATENT DOCUMENTS

| | | | |
|---|---|---|---|
| 4,966,862 A * | 10/1990 | Edmond | 438/27 |
| 5,187,547 A | 2/1993 | Niina et al. | |
| 5,214,306 A | 5/1993 | Hashimoto | |
| 5,233,204 A | 8/1993 | Fletcher et al. | |
| 5,345,092 A | 9/1994 | Kurihara | |
| 5,429,954 A | 7/1995 | Gerner | |
| 5,898,192 A | 4/1999 | Gerner | |
| 6,005,257 A * | 12/1999 | Estrera et al. | 257/11 |
| 6,229,160 B1 | 5/2001 | Krames et al. | |
| 6,281,524 B1 | 8/2001 | Yamamoto et al. | |
| 6,730,939 B2 | 5/2004 | Eisert et al. | |
| 6,740,906 B2 * | 5/2004 | Slater et al. | 257/99 |
| 6,995,030 B2 * | 2/2006 | Illek et al. | 438/29 |
| 2002/0093023 A1 | 7/2002 | Camras et al. | |
| 2006/0131599 A1 * | 6/2006 | Slater et al. | 257/98 |

FOREIGN PATENT DOCUMENTS

| | | |
|---|---|---|
| DE | 41 30 878 | 3/1993 |
| DE | 43 05 296 | 8/1994 |
| DE | 44 27 840 | 2/1996 |
| DE | 195 37 544 | 4/1997 |
| DE | 198 07 758 A1 | 12/1998 |
| JP | 05-327012 | 10/1993 |

* cited by examiner

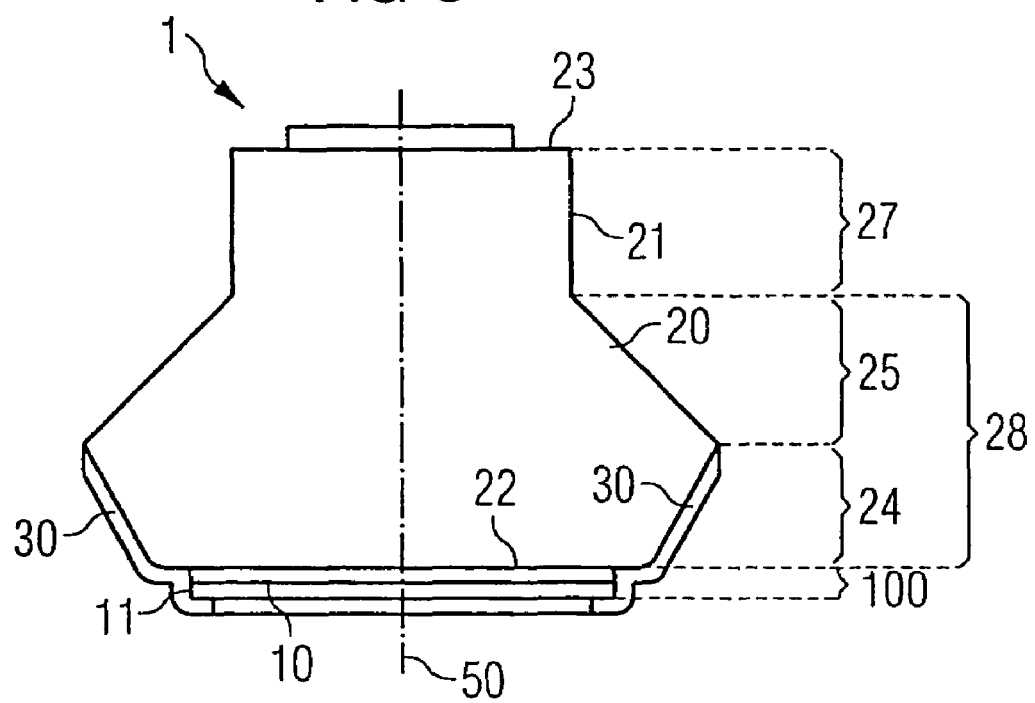
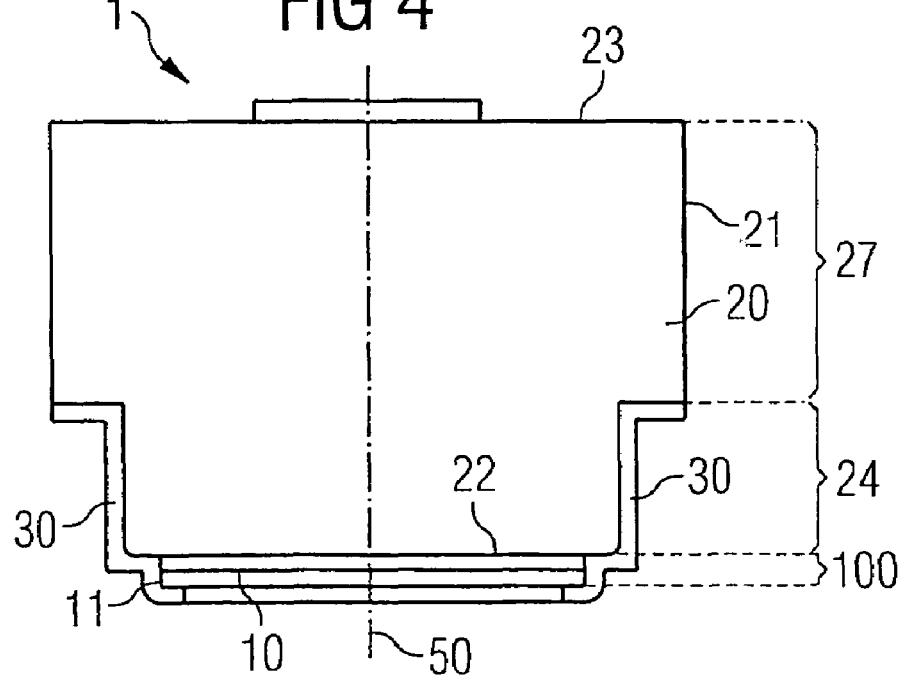

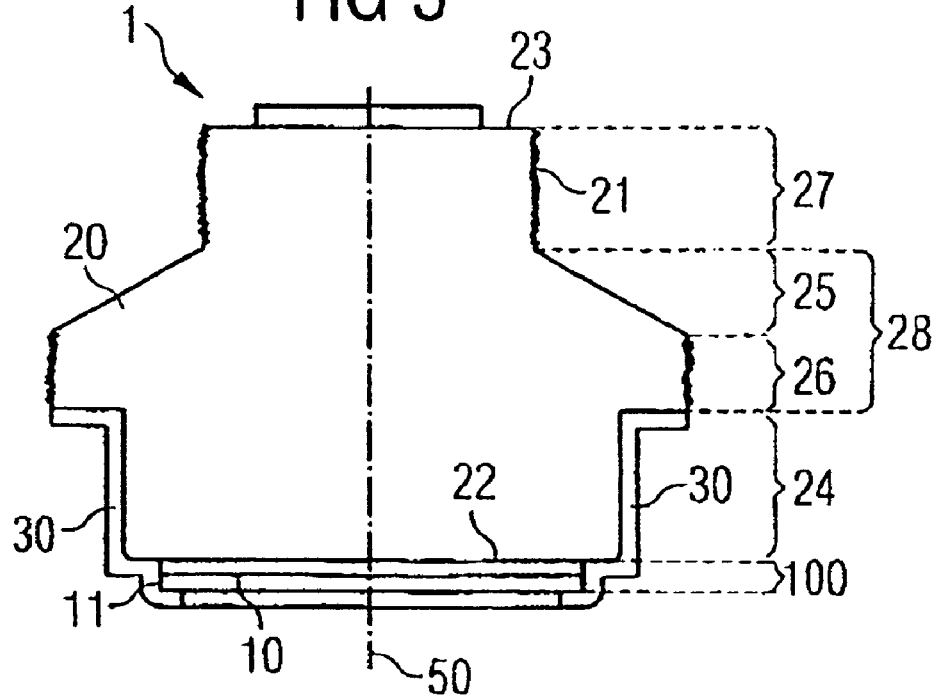
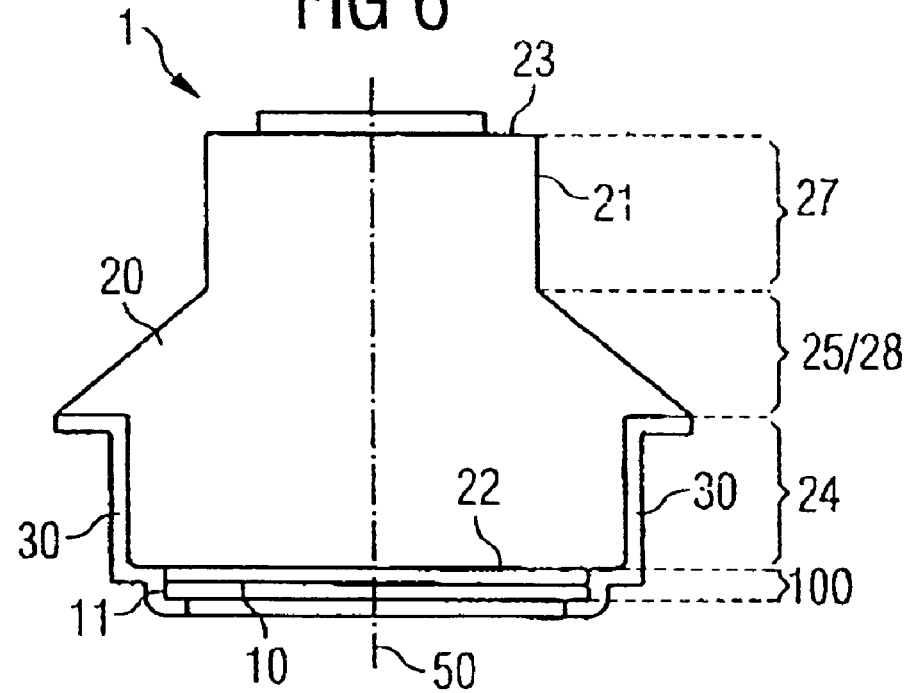

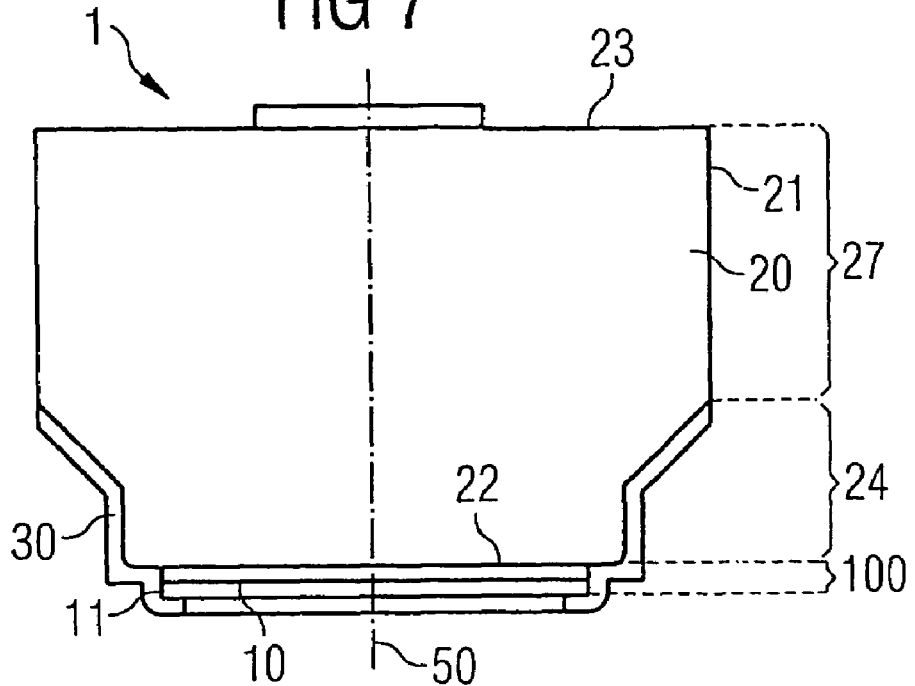
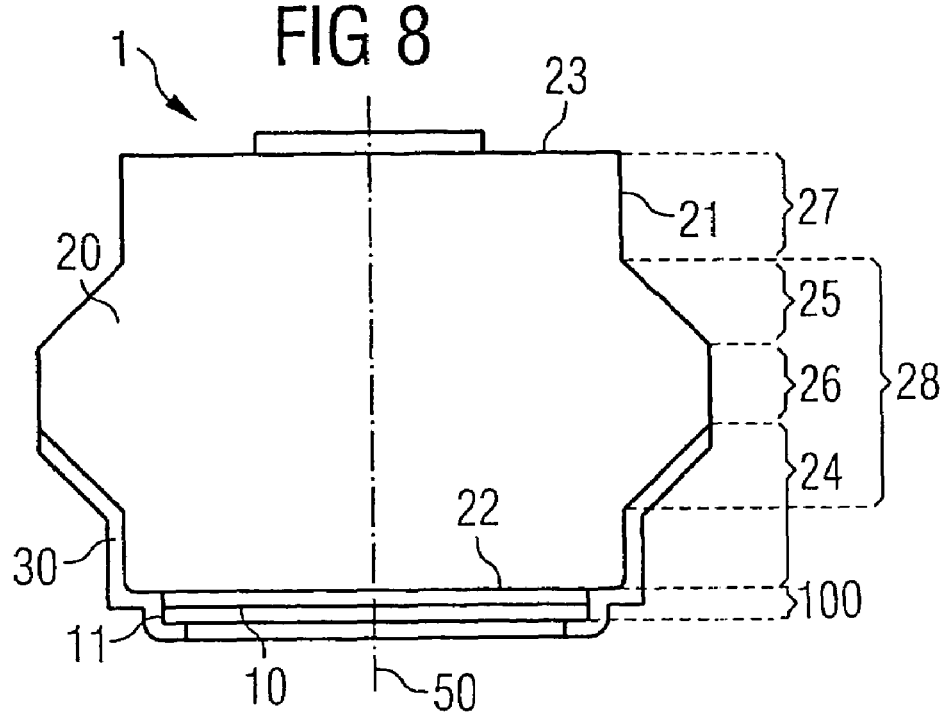

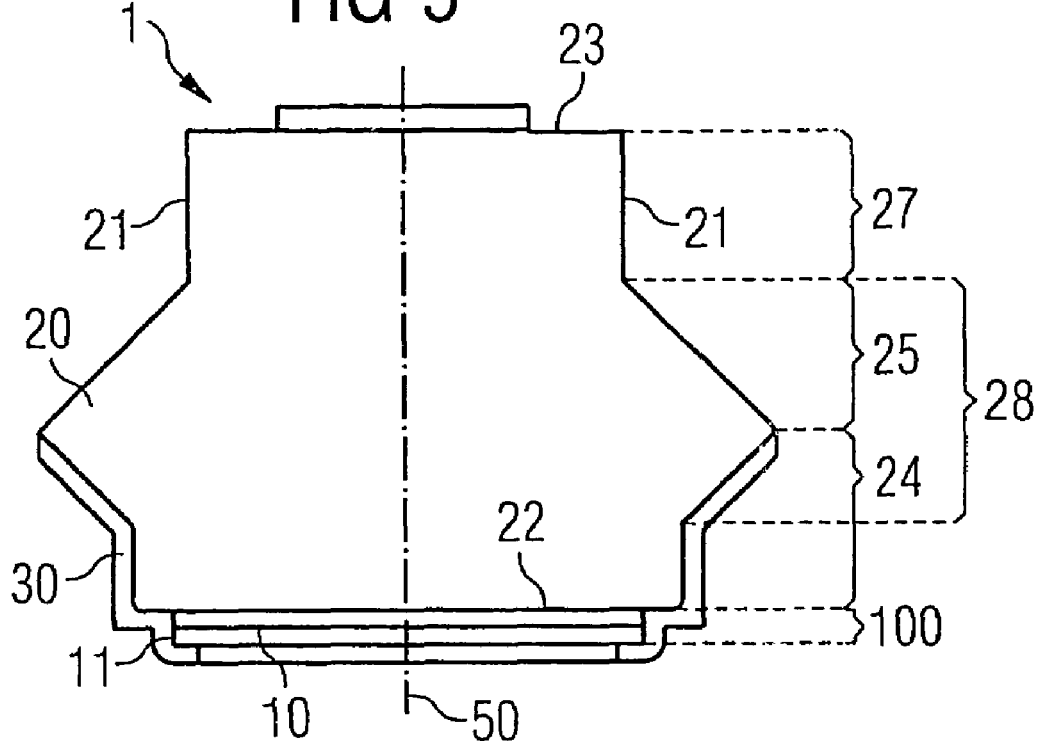
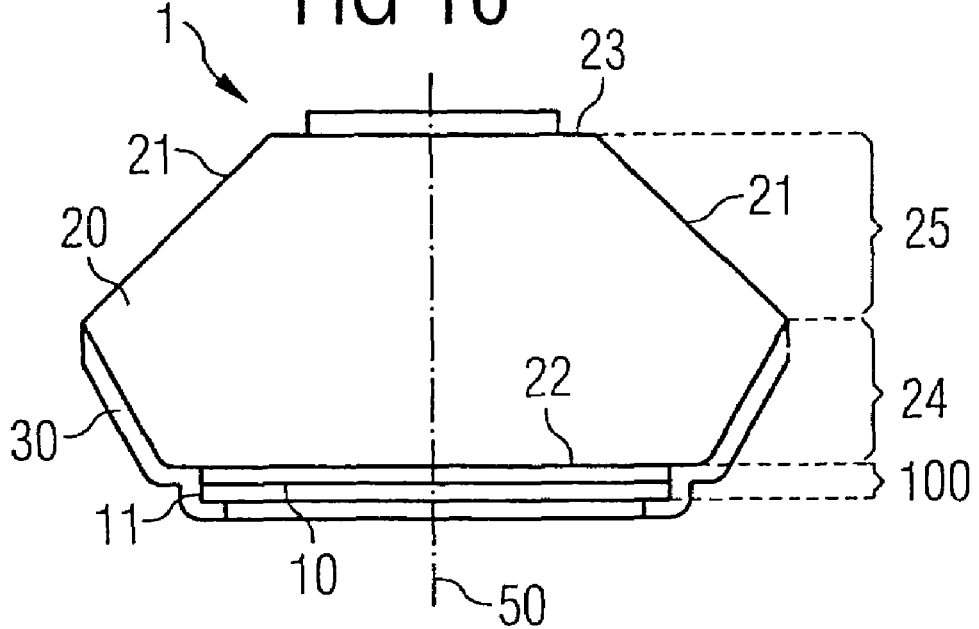

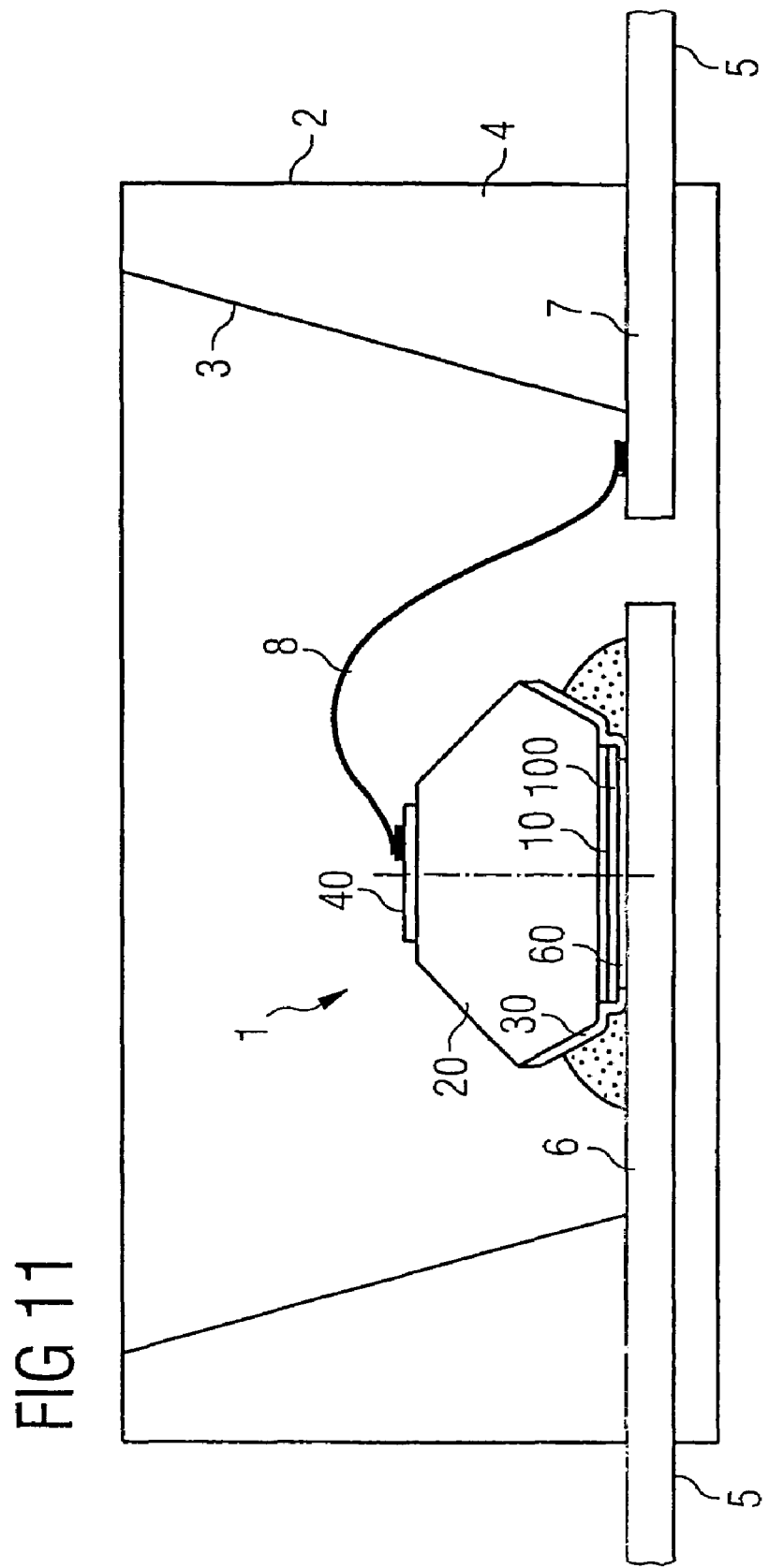

US 7,446,344 B2

RADIATION-EMITTING SEMICONDUCTOR CHIP, METHOD FOR PRODUCTION THEREOF AND RADIATION-EMITTING COMPONENT

RELATED APPLICATIONS

This is a U.S. national stage of International application No. PCT/DE02/03668 filed on 27 Sep. 2002.

This patent application claims priority of German patent application No. 10148227.2 filed 28 Sep. 2001, the disclosure of which is hereby incorporated by reference.

FIELD OF THE INVENTION

The invention relates to a radiation-emitting semiconductor chip having a multilayer structure containing a radiation-emitting active layer, and having a window layer, which is transmissive to a radiation emitted by the active layer and is arranged downstream of the multilayer structure in the direction of a main radiating direction of the semiconductor component. It furthermore relates to a method for producing such a semiconductor chip and to a radiation-emitting component having such a semiconductor chip.

The invention relates, in particular, to a radiation-emitting semiconductor chip having a nitride-based radiation-emitting active multilayer structure applied on an SiC-based growth substrate, and to a radiation-emitting optical component equipped with such a radiation-emitting semiconductor element.

BACKGROUND OF THE INVENTION

Typically, for radiation-emitting optical components, in particular for light-emitting diode components, at the present time use is made, in practice, essentially exclusively of parallelepipedal radiation-emitting semiconductor chips which are generally embedded in transparent potting material. In this case, a major difficulty is posed by the great difference between the refractive indices of customary semiconductor materials of optical semiconductor elements (n>2.5) and the conventionally available potting materials (for example epoxy resin; $n_{Epoxy} \cong 1.5$). The critical angle of total reflection at the interface between semiconductor body and potting material is consequently very small. This is the reason why, on account of total reflection at the chip surfaces, a considerable part of the light generated in the active zone is not coupled out from the semiconductor body and is lost in the interior thereof. Given a predetermined electric current which flows through the semiconductor component for the purpose of generating the light, the brightness of the component is thus limited.

In the case of GaN-based light-emitting diode chips in which the epitaxial layer sequence is arranged on a substrate (for example a silicon carbide substrate) which has a higher refractive index than the epitaxial layer sequence, the particular problem arises, moreover, that, given a conventional parallelepipedal chip geometry, the proportion of radiation which is coupled out through the substrate flanks is coupled out at a very acute angle with respect to the substrate flank in the direction of the rear side of the chip. Consequently, this radiation impinges on a housing mounting area, on which the chip is fixed, at a very steep angle and very near to the chip. This entails the disadvantages that, firstly, on account of the acute angle of incidence, a large part of the radiation is absorbed in the chip mounting area and, secondly, there is a considerable risk of a certain part of the radiation impinging on the conductive adhesive usually used for fixing the chip and being absorbed by said conductive adhesive.

U.S. Pat. No. 6,229,160 proposes a radiation-emitting semiconductor body in which, in order to increase the luminous efficiency, a so-called primary window layer is arranged downstream of the active zone in the envisaged radiating direction of the semiconductor body, the continuous side surface of which forms an obtuse angle with the main plane, which is parallel to the layers of the multilayered heterostructure. The continuous side surface forms an obtuse angle of between 110° and 140° with the plane of the active zone. In this case, the primary window layer is formed by the growth substrate or by an epitaxial layer grown separately on said growth substrate.

In addition, in accordance with U.S. Pat. No. 6,229,160 the semiconductor body may have a further, so-called secondary, window layer which is applied at that side of the active zone which is remote from the primary window layer, that is to say at the underside of the semiconductor body by means of epitaxy or wafer bonding and whose continuous side surface forms an angle of between 40° and 70° with the plane of the active zone. The semiconductor body consequently has chip flanks which are oblique continuously from the top side to the underside.

This chip geometry primarily serves to make the chip surface which runs parallel to the active zone larger than the active zone and to have the effect that light which impinges on the oblique side walls of the primary window is reflected completely internally toward the envisaged radiating direction.

The secondary window layer additionally fulfils the task of coupling out light which is emitted from the active zone rearward, that is to say in the direction of the mounting area of the semiconductor body, from the semiconductor body via the oblique side areas of the secondary window layer.

In order to reduce a coupling-out of light in the backward direction and to deflect said light toward the front side preferably already in the semiconductor body, a reflective coating of the entire oblique chip flanks is proposed.

This known chip geometry, which is primarily directed at improving the coupling-out of light via the front side, raises the following problems, in particular:

(i) During the production of the oblique side areas, a considerable proportion of the area of the active epitaxial layer sequence present on the wafer is lost because these are produced by means of the production of a V-shaped trench from the side of the active zone.

(ii) The thickness of the secondary window layer is greatly limited in order that a sufficiently large chip mounting area is preserved, in the case of which
 the chip is not tilted in the course of its mounting in a light-emitting diode housing,
 a current expansion to as far as possible the entire active zone is ensured,
 a sufficient dissipation of heat from the active zone is assured, and
 the chip has sufficient chemical stability. It therefore amounts to preferably only approximately 10 to 40% of the lateral width of the active zone.

(iii) The oblique side flanks form, together with the chip mounting area of a light-emitting diode housing, a wedge-shaped gap which, in the case of conventional plastic LED housings, is generally filled with transparent potting material. In the event of an increase in the component temperature during operation and/or on account of an increase in the ambient temperature, as occurs for example in applications in motor vehicles, considerable mechanical forces act on the chip on account of the high thermal expansion of customary potting compositions, that are considerably increasing the risk of a delamination of the chip from the chip mounting area of the housing in comparison with parallelepipedal chips.

(iv) The production of the secondary window layer is associated with a considerable technical effort because this has to be additionally grown separately or has to be additionally applied by means of wafer bonding.

(v) The lower area of the chip, which represents the mounting area, is the smallest area of the semiconductor body, above which the greatly projecting upper window region is arranged. Therefore, there is the great risk that, in the case of an automatic chip mounting technique that is conventionally used in chip mounting, generally a pick and place method, a tilting of the chip and thus a tilting of the radiating axis of the corresponding light-emitting diode component may occur. This risk is reduced if only a primary window layer and no secondary window layer is present.

(vi) The thickness of the lower window layer that is possibly present must be kept as small as possible for the reasons mentioned above under (ii) and (v). This means, however, that a substantial part of this window is covered by an adhesive that is usually used for the mounting of light-emitting diode chips and so said window cannot contribute completely or cannot contribute at all to the coupling-out of light.

Items (ii) and (v) increase in importance as the edge length of the chip decreases, that is to say as the cross section of the active zone becomes smaller, which is permanently striven for with regard to the largest possible chip yield from a single wafer, because the smaller the edge length, the smaller becomes the resulting mounting area of the chip given the chip geometry proposed. For these reasons, the lower window layer is made as thin as possible or omitted.

The chip geometry disclosed in U.S. Pat. No. 6,229,160, if it is suitable at all, is suitable in practically expedient fashion only for material systems based on GaP, in which it is possible to epitaxially produce thick layers of both conduction types which are sufficiently electrically conductive to realize, in particular, the proposed lower window layer and at the same time to be able to achieve a current expansion to approximately the entire active zone.

In the nitride-based semiconductor material system, comprising in particular GaN, InN and AlN and all ternary and quaternary mixed crystals based on GaN, InN and AlN, such as, for example, AlGaN, InGaN, AlInN and AlGaInN, p-conductively doped layers, in particular, have a sufficiently low electrical resistance only when they are comparatively thin. Therefore, a thick lower window in accordance with the arrangement described above can be realized, in particular in the case of conventionally used active layer sequences based on GaN, in which the lower window layer would have to be arranged on the p-conducting side, with the difficulties explained above being accepted, only by means of wafer bonding, which is associated with high technical effort.

U.S. Pat. No. 5,233,204 discloses a geometry of a light-emitting semiconductor body based on InGaAlP, in which a thick transparent epitaxial layer comprising GaP, GaAsP or AlGaAs is arranged between an absorbent substrate and an active layer structure. The side areas of the thick transparent epitaxial layer are oblique with respect to the active layer structure, in such a way that a funnel-shaped layer is produced. As a result, more of the radiation emitted by the active layer structure toward the substrate impinges on the side area of the transparent layer at an angle which is less than the angle of total reflection.

However, considerable light losses occur in the case of the chip geometry proposed in U.S. Pat. No. 5,233,204. On the one hand on account of total reflection at the interface between the active layer structure and the thick transparent epitaxial layer (refractive index$_{active\ layer}$>refractive index$_{window}$) and subsequent absorption in the active layer sequence. On the other hand on account of absorption in the radiation-absorbing growth substrate. Furthermore, the production of the window layer produced as a thick transparent epitaxial layer requires a considerable additional technical effort.

In order to improve the coupling-out of light, it has been proposed elsewhere to produce semiconductor components having a for example triangular or parallelogram-like lateral cross section; in this respect, see the publication Song Jae Lee, Seog Won Song: "Efficiency Improvement in Light-Emitting Diodes Based on Geometrically Deformed Chips", SPIE Conference on Light-Emitting Diodes, San Jose, Calif., January 1999, pages 237 to 248. In these arrangements, the reflections in the chip are increased because the angles of reflection change often. At the same time, therefore, it is necessary, however, to form the radiation-generating layer, the contacts or other layers of the semiconductor component such that they absorb as little light as possible.

SUMMARY OF THE INVENTION

One object of the invention is to provide a radiation-emitting semiconductor chip of the type mentioned in the introduction with improved coupling-out of light, which is suitable for the mass production of light-emitting diode components, and in which, in particular, a high chip yield from a single wafer is also ensured and which is suitable for mounting in conventional light-emitting diode housings by means of conventional automatic chip mounting installations that are used in semiconductor technology.

Another object of the invention is to provide a method for producing such a semiconductor chip.

A further object of the invention is to provide an improved radiation-emitting optical component.

These and other objects are attained in accordance with one aspect of the invention directed to a radiation-emitting semiconductor chip, having a multilayer structure containing a radiation-emitting active layer, and having a window layer, which is transmissive to a radiation emitted by the active layer and is arranged downstream of the multilayer structure in the direction of a main radiating direction of the semiconductor component. The window layer has at least one peripheral side area, which, in the course from a first main area facing the multilayer structure in the direction toward a second main area remote from the multilayer structure, firstly has a first side area region which is beveled, curved or stepped in such a way that the window layer widens with respect to the size of the first main area. A peripheral side area of the multilayer structure and at least a part of the beveled, curved or stepped first side area region are coated with a continuous electrically insulating layer.

Another aspect of the present invention is directed to a method for simultaneously producing a multiplicity of semiconductor chips as described just above, including growing a multilayer sequence on a substrate wafer produced from a material which is transmissive to a radiation emitted by the active layer, and patterning of the multilayer sequence into a multiplicity of mutually separated multilayer structures on the substrate wafer, in such a way that separating tracks reaching as far as the substrate wafer are formed between the multilayer structures. The first side wall regions are produced, in particular by sawing into the substrate wafer between the multilayer structures using a saw blade with a V-shaped, curved or stepped shaping edge. The electrically insulating layer is applied to the side areas of the multilayer structures and to the first side wall regions. The substrate wafer is severed along the separating tracks, in particular by means of breaking or laser separation, thereby producing the multiplicity of mutually separate semiconductor chips.

The term "nitride-based" as used herein includes, in particular, all semiconductor mixed crystals having binary, ternary and quaternary nitrogen, such as GaN, InN, AlN, AlGaN, InGaN, InAlN and AlInGaN.

The term "SiC-based" includes any mixed crystal whose essential properties are formatively influenced by the constituents Si and C.

The term growth substrate is to be understood to be the substrate used as a basis for the epitaxial growth of the very first layer of the active layer sequence.

Furthermore, the term front side or top side means that side of the semiconductor body which is arranged downstream of the active multilayer sequence in the envisaged radiating direction of the component (also referred to herein as the main radiating direction). Consequently, the term rear side or underside means that side of the semiconductor body which is remote from the front side.

In the case of the semiconductor body of the type mentioned in the introduction, according to the invention, the transparent window layer has at least one side wall which runs, as seen from the multilayer structure, in the direction away from the multilayer structure, over a first layer thickness section of the window layer, in oblique, curved or stepped fashion away from a center axis of the semiconductor body that is perpendicular to the growth plane of the epitaxial layers.

In a preferred embodiment, the side wall runs, in the further course, away from the multilayer structure, over a second layer thickness section of the window layer, in oblique, curved or stepped fashion toward the center axis of the semiconductor body that is perpendicular to the growth plane of the epitaxial layers.

In another embodiment, in the further course, away from the multilayer structure, that is to say over a third layer thickness section adjoining the second layer thickness section, the side wall of the window layer is parallel to the center axis, that is to say perpendicular to the main plane of the multilayer structure.

The semiconductor body's geometry according to the invention has the further advantage that the loss of active multilayer structure is kept low during the production of said geometry. Virtually the entire wafer area can be utilized as active zone for the semiconductor bodies. The number of semiconductor bodies per wafer that is achieved with the chip geometry according to the invention is only slightly reduced compared with the production of conventional parallelepipedal semiconductor bodies.

The semiconductor body's geometry according to the invention is particularly preferably suitable in particular for semiconductor bodies having a nitride-based active multilayer structure (that is to say comprising the material system $In_{1-x-y}Al_xGa_yN$ where $0 \leq x \leq 1$, $0 \leq y \leq 1$ and $x+y \leq 1$) on an SiC-based substrate or another transparent substrate whose material has a greater refractive index than the active multilayer structure. One reason for this is that nitride-based layers have a sufficiently low electrical resistance only when they are very thin. This applies especially to p-doped layers of this type.

The semiconductor body according to the invention with the tapering window region is able, on account of an improved overlap—compared with conventional parallelepipedal chips—between the angular range of radiation impinging on the substrate flanks and the angular range that can be coupled out through the substrate flanks, to couple out a comparatively large part of the radiation generated in the active zone as early as in the event of the first chip passage, that is to say in the event of the first impingement of radiation on the chip surface. This reduces the total reflection at the side areas, increases the direct coupling-out of light and reduces the absorption through long optical paths and many reflections in the component or adjoining window regions.

That part of the window layer which tapers in oblique, curved or stepped fashion is formed for example in such a way that a large part of the radiation coupled out from the semiconductor component through the side flanks is radiated in the angular range between 50° and 90° relative to the center axis of the semiconductor component. What is thus achieved is that, in the case of housing designs with a reflector which are conventionally used for light-emitting diode components, the radiation which is coupled out laterally through the window layer impinges on the oblique side walls of the reflector. This has the significant advantage that the radiation impinges on the reflector inner walls at a comparatively obtuse angle, as a result of which an improved reflection is achieved in particular in the case of plastic reflector walls.

In the case of conventional parallelepipedal chips, by contrast, the main part of the radiation coupled out through the window layer impinges on the bottom of the reflector owing to the steep radiating angle from the chip flanks, comparatively little radiation being reflected from said bottom of the reflector on the one hand owing to the steeper angle of impingement of the radiation and on the other hand owing to the unavoidable partial covering of the bottom with adhesive.

It is furthermore particularly preferred for the material of the window layer to have a larger refractive index than the material of the active multilayer structure adjoining said window layer. This advantageously reduces the reflection of the radiation emitted rearward from the active zone at the interface between multilayer structure and window layer and the radiation coupled into the window layer is compressed.

The chip geometry according to the invention is particularly preferably used in the case of nitride-based LED chips, in which the active multilayer structure is produced on an SiC or SiC-based growth substrate. In this case, refractive index$_{active\ layer}$>refractive index$_{substrate}$ holds true.

In the case of a chip having a square cross section, the ratio of edge length multilayer structure/edge length window front side is preferably greater than 1. In the case of planar oblique side areas of the window, these particularly preferably form an angle $\alpha$ not equal to 0° and not equal to 90° with the center axis of the semiconductor component, for which angle it preferably holds true that $2° \leq \alpha \leq 70°$.

In the case of this refinement, on the one hand a good current expansion to the area of the multilayer structure is ensured and, on the other hand, the voltage drop in the window layer during operation of the semiconductor chip lies in an acceptable range.

A further advantageous refinement provides for at least the oblique, curved or stepped region of the window layer to be roughened.

It is particularly advantageous if the window layer is formed from the growth substrate, such as, for example in the case of a nitride-based compound semiconductor multilayer structure, from an SiC-based growth substrate.

In the case of a radiation-emitting optical component according to the invention, which contains a radiation-emitting semiconductor chip having the features disclosed above, the semiconductor chip is mounted in top-down mounting, that is to say with the radiation-emitting multilayer structure downward in a reflector recess of a housing basic body. The reflector recess preferably has a preferably planar bottom area onto which the radiation-emitting semiconductor chip is mounted and which is at least partly enclosed by a planar reflector wall which is oblique with respect to the bottom area. The housing basic body is produced from a reflective material, in particular from a corresponding plastic, which is preferably filled with reflection-increasing material, and has electrical connection elements. The semiconductor chip is placed onto the bottom area by its multilayer structure, more precisely with a contact and connection layer applied on the latter, and is connected to said bottom area for example by means of electrically conductive adhesive or metallic solder as electrically conductive connecting means.

The height of the insulating layer along the side areas of the multilayer structure and the first side area region of the window layer is chosen such that the electrically conductive connecting means cannot produce a short circuit between mounting side of the multilayer structure and window layer.

In a particular embodiment, the lateral reflector walls are formed parabolically in such a way that a radiation which is coupled out via the oblique, curved or stepped second side wall region and impinges on these areas is deflected toward a radiating direction of the component, in particular is reflected upward to the greatest possible extent in a parallel fashion in a predetermined direction with respect to the active layer.

The reflector walls may advantageously be formed in highly reflective fashion in a simple manner, for example by means of Al or Ag coating. There is, moreover, no risk of a contamination of the oblique reflector walls with adhesive or solder during the mounting of the semiconductor component into the housing.

The contact layer, for example a contact metallization at the multilayer structure, is preferably a grid contact. It has been ascertained that the back-reflection of the radiation emitted toward the mounting side of the chip in the direction of the front side is improved if the rear side contact metallization is not formed over the whole area and the interspaces between the grid lines are preferably filled with better reflective material.

In a method for simultaneously producing a multiplicity of radiation-emitting components according to the invention, it is provided that, after the application and preferably patterning of an epitaxial layer sequence to form a multiplicity of active multilayer structures arranged next to one another and application of the insulation layer on a large-area substrate wafer, first shaping sawing cuts are introduced into the substrate wafer between the multilayer structures, which have preferably been separated from one another beforehand, from the side of the multilayer structures, the profile of which cuts corresponds to the desired profile of the first side area region. Afterward, from that side of the substrate wafer which is remote from the multilayer structure, second shaping sawing cuts are introduced into said substrate wafer opposite the first sawing cuts, and their profile corresponds to the desired profile of the second side wall regions before the substrate thickness which, if appropriate, has remained and has not yet been sawn through is severed for example by means of breaking, laser separation or sawing, thereby producing mutually separate radiation-emitting semiconductor chips.

If necessary, in the case of the first and second sawing cuts, the saw blades have shaping edges. In the present case, the term shaping edge is to be understood as an end side—shaped according to specific requirements—of the saw blade for the production of an envisaged geometry of the sawing trench. In the present case, the shaping edge has the negative form of the oblique, curved or stepped part of the window layer and is consequently formed in V-shaped, curved or stepped fashion.

Before the sawing-in process by means of the saw blade with a shaping edge, the active multilayer structure is particularly preferably severed along the envisaged sawing cuts, preferably be means of etching.

In a further preferred embodiment of the method, it is provided that the contact areas, in particular formed by metallization layers, are already produced before the process of sawing into the substrate wafer.

In a particularly preferred development of the method, firstly a GaN-based epitaxial layer sequence is applied on an SiC-based substrate wafer, said epitaxial layer sequence being suitable for emitting radiation in the ultraviolet, blue and/or green spectral range. The substrate material is preferably chosen such that it is at least partly transmissive at least for a large part of the radiation emitted by the active zone of the multilayer structure and has a greater refractive index than the material of the epitaxial layer sequence.

Afterward, contact layers are applied on the front side of the epitaxial layer sequence and on the rear side of the substrate wafer before the epitaxial layer sequence is then preferably separated by means of etching to form a multiplicity of mutually separate active multilayer structures.

The shaping sawing steps are then effected.

In an advantageous development, the substrate wafer is thinned, for example by means of grinding and/or etching, before the second shaping sawing cuts are carried out.

BRIEF DESCRIPTION OF THE DRAWINGS

Further preferred embodiments and developments of the invention emerge from the exemplary embodiments described below in conjunction with FIGS. 1 to 12D, in which:

FIG. 3 shows a diagrammatic illustration of a cross section through a third embodiment of a radiation-emitting semiconductor chip according to the invention;

FIG. 4 shows a diagrammatic illustration of a cross section through a fourth embodiment of a radiation-emitting semiconductor chip according to the invention;

FIG. 5 shows a diagrammatic illustration of a cross section through a fifth embodiment of a radiation-emitting semiconductor chip according to the invention;

FIG. 6 shows a diagrammatic illustration of a cross section through a sixth embodiment of a radiation-emitting semiconductor chip according to the invention;

FIG. 7 shows a diagrammatic illustration of a cross section through a seventh embodiment of a radiation-emitting semiconductor chip according to the invention;

FIG. 8 shows a diagrammatic illustration of a cross section through an eighth embodiment of a radiation-emitting semiconductor chip according to the invention;

FIG. 9 shows a diagrammatic illustration of a cross section through a ninth embodiment of a radiation-emitting semiconductor chip according to the invention;

FIG. 10 shows a diagrammatic illustration of a cross section through a tenth embodiment of a radiation-emitting semiconductor chip according to the invention;

FIG. 11 shows a diagrammatic illustration of a cross section through a radiation-emitting component according to the invention.

DETAILED DESCRIPTION OF THE DRAWINGS

In the Figures, respectively identical or identically acting constituent parts of the exemplary embodiments are in each case provided with the same reference symbols.

Figure 1:
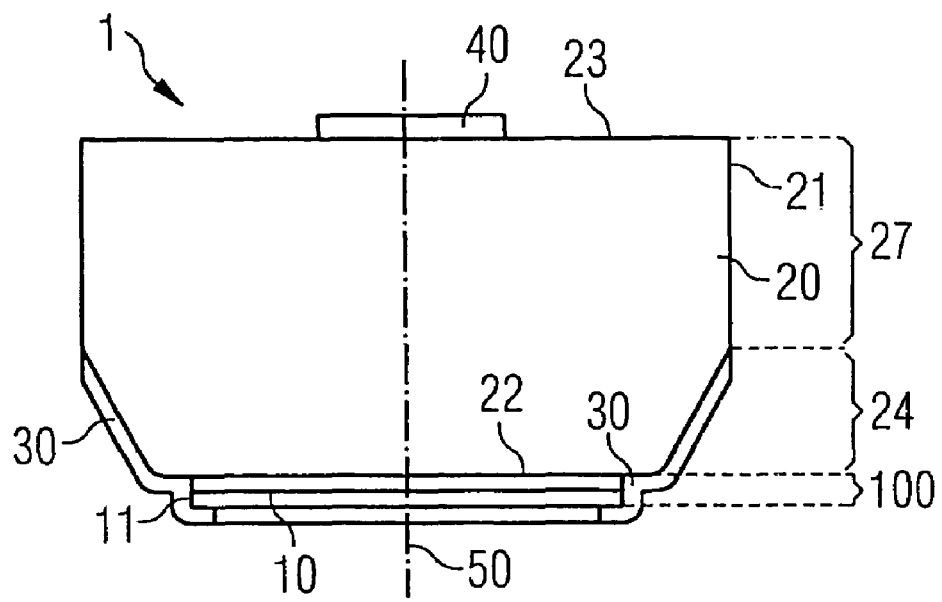
FIG. 1 shows a diagrammatic illustration of a cross section through a first embodiment of a radiation-emitting semiconductor chip according to the invention.

FIG. 1 shows purely diagrammatically a cross section through a radiation-emitting semiconductor chip 1 according to the invention. An active layer 10 that generates the light, for example a single quantum well (SQW) or multiple quantum well (MQW) structure based on InGaN, lies within a multilayer structure 100, which, by way of example, comprises overall a plurality of nitride-based semiconductor layers. The precise construction of such a multilayer structure is dependent on the material system and the desired properties of the component. Details in this respect are disclosed in the prior art and therefore are not explained in any further detail in the present context.

The multilayer structure 100 is produced for example by metal organic vapor phase epitaxy methods on a window layer 20 having an electrical contact 40 at its side 23 remote from the multilayer structure. On its side remote from the window layer 20, the multilayer structure 100 has a second electrical contact 60, which, in the exemplary embodiment, covers the multilayer structure 100 in a large-area manner. The electrical contact 60 (see FIG. 11) is preferably formed in reflective fashion or has an additional reflection layer.

The contact 60 may also have a grid structure, and material which has a better reflectivity for a radiation emitted by the multilayer structure may be arranged between the grid lines.

The window layer 20 is formed from the growth substrate material, and preferably comprises silicon carbide or an SiC-based material, while the multilayer structure 100 is based on gallium nitride. This means that the multilayer structure 100 contains, in addition to nitrogen, for example the elements indium, aluminum and/or gallium. In this material system, p-doped layers are sufficiently electrically conductive only when they are comparatively thin.

In another material system, the layers of the multilayer sequence 100 and the substrate may be formed differently. By way of example, in the material system InGaAlP, a conductivity with thick layers is possible. The substrate may be sapphire or SiC. Whereas a transparent window may therefore be additionally grown above the multilayer structure 100 in this material system, it is not possible to form such an epitaxially grown window in the material system of gallium nitride.

The window layer 20 has at least one peripheral side area 21 which has, in the course from the first main area 22 facing the multilayer structure 100 in the direction toward the second main area 23 of the window layer 20, said second main area being remote from the multilayer structure 100, firstly a first side area region 24 which is beveled and runs completely around the chip in such a way that the window layer firstly widens relative to the size of the first main area 22. After this beveled first side wall part 24, the window layer 20 has a side area region 27 perpendicular to the main plane of extent of the multilayer structure 100. The peripheral side area 11 of the multilayer structure 100 and the beveled side wall part 24 are coated with a continuous electrically insulating layer 30, which comprises silicon oxide or silicon nitride, for example.

This semiconductor chip 1 is intended for top-down mounting.

The embodiment of FIG. 2 differs from that of FIG. 1 in particular by virtue of the fact that there is arranged downstream of the first side area region 24, in the further course toward the second main area 23, firstly a side wall region 26, which is essentially perpendicular to the main plane of extent of the multilayer structure 100, and the window layer 20 subsequently tapers again over a side wall region 25 running obliquely with respect to the main plane of extent of the multilayer structure 100. There is arranged downstream of this tapering part of the window layer 20, in turn, a side wall region 27, which is perpendicular to the main plane of extent of the multilayer structure 100 and leads as far as the second main area 23 of the window layer 20. The oblique side wall region 25 over which the window layer 20 tapers preferably runs completely around the chip and forms an angle α with an axis 50 that is perpendicular to the main plane of extent of the multilayer structure 100, said angle lying between 10° and 80°, preferably between 20° and 60°.

Figure 2:
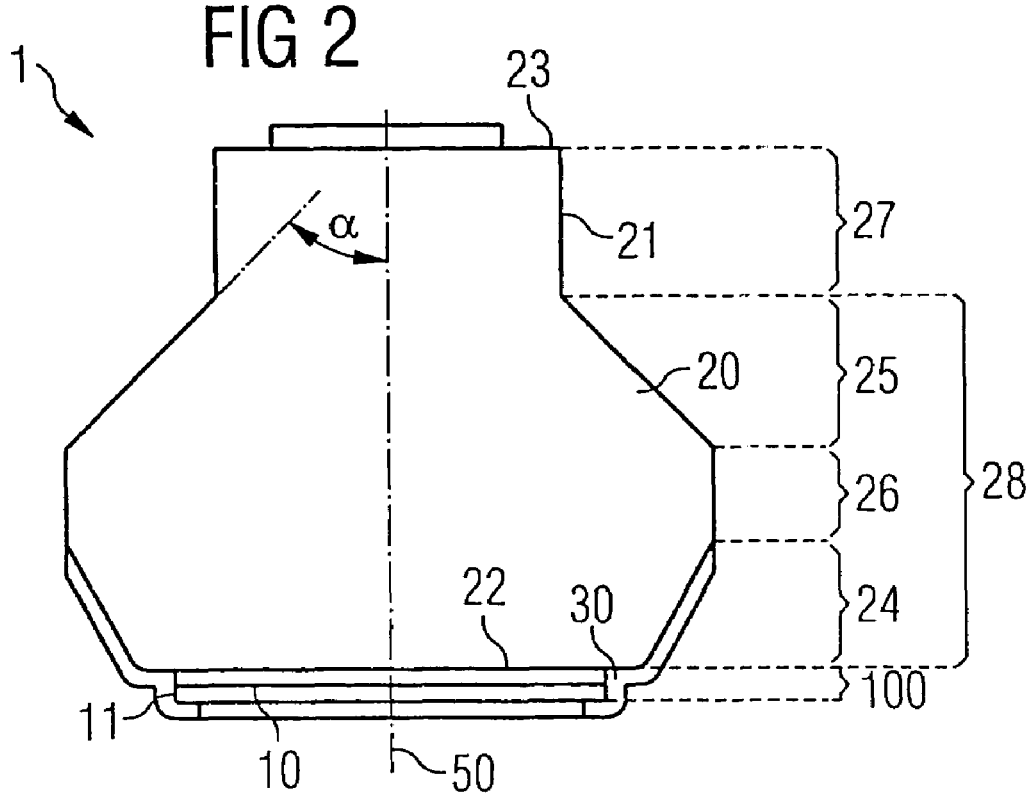
FIG. 2 shows a diagrammatic illustration of a cross section through a second embodiment of a radiation-emitting semiconductor chip according to the invention.
Figure 12A:
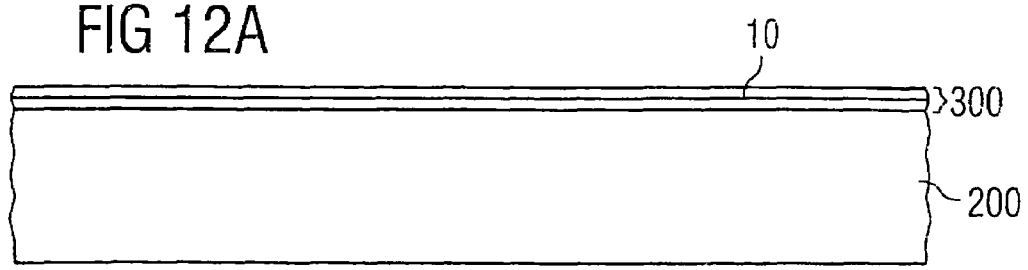
FIGS. 12A to 12D show a diagrammatic illustration of method steps for simultaneously producing semiconductor chips according to the invention.
Figure 12B:
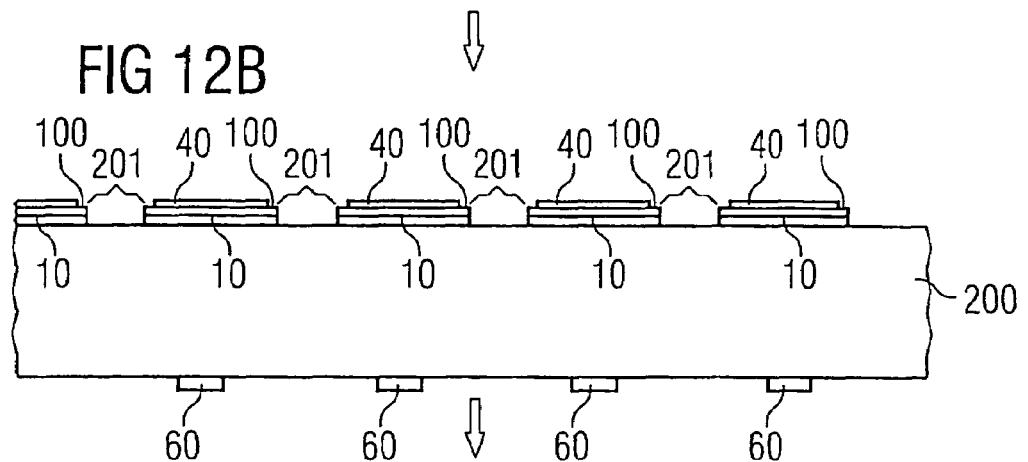
Figure 12C:
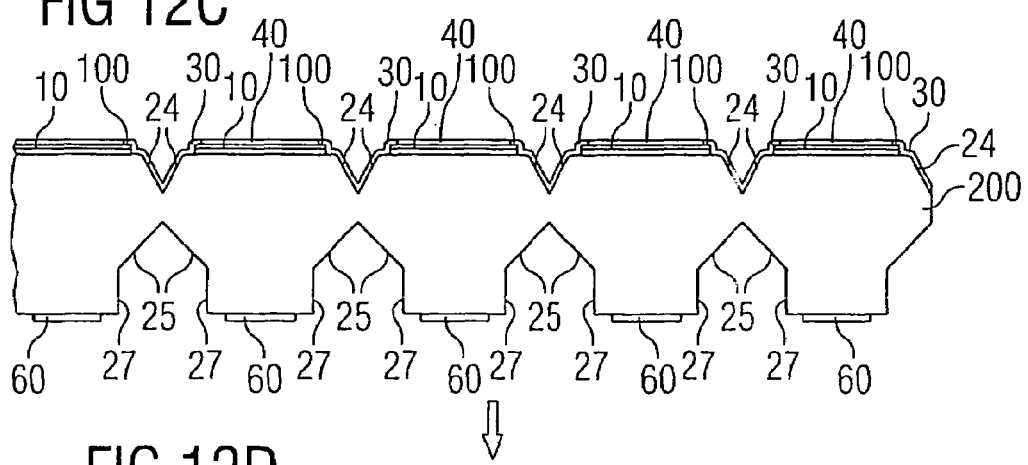
Figure 12D:
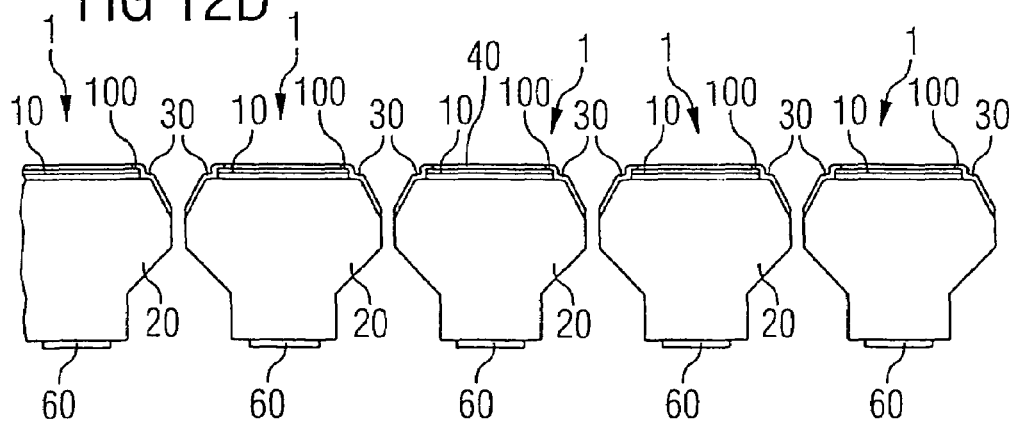

The embodiment of FIG. 3 differs from that of FIG. 2 in particular in that the side wall region 26 perpendicular to the main plane of extent of the multilayer structure 100 of FIG. 2 is not present between the first oblique side wall region 24 and the second oblique side wall region 25.

In the case of the embodiment of FIG. 4, proceeding from the first main area 22 of the window layer, a stepped side wall part 24 which runs completely around the chip is embodied in the form of a right-angled shoulder, downstream of which is arranged a side wall region 27, which is perpendicular to the main plane of extent of the multilayer structure 100 and leads as far as the second main area 23 of the window layer 20. The peripheral side area 11 of the multilayer structure 100 and the stepped side wall part 24 are coated with a continuous electrically insulating layer 30, which comprises silicon oxide or silicon nitride, for example.

The embodiment of FIG. 5 differs from that of FIG. 4 in particular by virtue of the fact that there is arranged downstream of the first side area region 24, in the further course toward the second main area 23, firstly a side wall region 26, which is essentially perpendicular to the main plane of extent of the multilayer structure 100, and the window layer 20 subsequently tapers again over a side wall region 25 running obliquely with respect to the main plane of extent of the multilayer structure 100. There is arranged downstream of this tapering part 25 of the window layer 20, in turn, a side wall region 25, which is perpendicular to the main plane of extent of the multilayer structure 100 and leads as far as the second main area 23 of the window layer 20. The oblique side wall region 27 over which the window layer 20 tapers preferably runs completely around the chip and forms an angle a with an axis 50 that is perpendicular to the main plane of extent of the multilayer structure 100, said angle lying between 10° and 80°, preferably between 20° and 60°.

The embodiment of FIG. 6 differs from that of FIG. 5 in particular in that the side wall region 26 perpendicular to the main plane of extent of the multilayer structure 100 of FIG. 2 is not present between the first oblique side wall region 24 and the second oblique side wall region 25.

In the case of the embodiment of FIG. 7, proceeding from the first main area 22 of the window layer, a stepped side wall part 24 which runs completely around the chip is embodied in the form of an obtuse-angled shoulder, downstream of which is arranged a side wall region 27, which is perpendicular to the main plane of extent of the multilayer structure 100 and leads as far as the second main area 23 of the window layer 20. The peripheral side area 11 of the multilayer structure 100 and the stepped side wall part 24 are coated with a continuous electrically insulating layer 30, which comprises silicon oxide or silicon nitride, for example.

The embodiment of FIG. 8 differs from that of FIG. 7 in particular by virtue of the fact that there is arranged downstream of the first side area region 24, in the further course toward the second main area 23, firstly a side wall region 26, which is essentially perpendicular to the main plane of extent of the multilayer structure 100, and the window layer 20 subsequently tapers again over a side wall region 25 running obliquely with respect to the main plane of extent of the multilayer structure 100. There is arranged downstream of this tapering part 25 of the window layer 20, in turn, a side wall region 27, which is perpendicular to the main plane of extent of the multilayer structure 100 and leads as far as the second main area 23 of the window layer 20. The oblique side wall region 25 over which the window layer 20 tapers preferably runs completely around the chip and forms an angle α with an axis 50 that is perpendicular to the main plane of extent of the multilayer structure 100, said angle lying between 10° and 80°, preferably between 20° and 60°.

The embodiment of FIG. 9 differs from that of FIG. 8 in particular in that the side wall region 26 perpendicular to the main plane of extent of the multilayer structure 100 of FIG. 2 is not present between the first oblique side wall region 24 and the second oblique side wall region 25.

In the case of the embodiments of FIGS. 2, 3, 5, 6, 8 and 9, the side wall regions 24, 25 and, if appropriate, 26 form a peripheral protrusion 28, which, on the one hand, receives an insulating coating 30 and, on the other hand, improves the coupling-out of the radiation from the chip through the oblique side wall part 25.

In the case of the embodiment of FIG. 10, unlike in the case of the embodiment of FIG. 9, the second oblique side wall part 25 is not adjoined by a side wall part 27 perpendicular to the main plane of extent of the multilayer structure 100, rather the second oblique side wall part 25 directly forms an edge with the second main area 23. This embodiment variant may equally be employed in the case of the embodiments of FIGS. 2, 3, 5, 6 and 8. The voltage drop in the chip is advantageously reduced in the case of this embodiment variant because the resistance of the window layer drops as its mean cross-sectional area is increased and as the window layer is made thinner.

The oblique side wall parts described above may alternatively be formed in suitably curved or stepped fashion. They may furthermore be roughened. Equally, it is also additionally possible, if appropriate, for the side wall parts 26 and 27 to be roughened.

In the case of the radiation-emitting component illustrated in FIG. 11, a radiation-emitting chip 1 in accordance with the embodiment of the FIG. 10 is mounted in a recess 3 of a housing basic body 4 of a component housing 2 by means of an electrically conductive adhesive or by means of a metallic solder onto a chip mounting area 6 of an electrical leadframe 5, in such a way that the multilayer structure 100 with the contact 60 faces toward the chip mounting area 6 and the window layer 20 is arranged on that side of the multilayer structure 100 which is remote from the chip mounting area 6. This type of mounting is so-called top-down mounting. The contact 40 on the window layer is connected to a wire pad 7 of the leadframe 5 by means of a bonding wire 8. The recess 3 is filled for example with a radiation-transmissive reaction resin and the side areas of the recess 3 are preferably formed in reflective fashion, so that the recess forms a reflector for a radiation emitted laterally from the chip.

In the case of the method detail—illustrated diagrammatically in FIG. 12—of a method for simultaneously producing a multiplicity of semiconductor chips in accordance with the embodiment of FIG. 8, firstly a multilayer sequence 300 is grown on a substrate wafer 200, which is produced from a material which is transmissive to a radiation emitted by the active layer 10. The multilayer sequence is then patterned into a multiplicity of mutually separated multilayer structures 100 in that separating tracks 201 reaching as far as the substrate wafer 200 are formed between the multilayer structures 100. Afterward, the first side wall regions 24 are produced, in particular by sawing into the substrate wafer between the multilayer structures 100 using a saw blade with a V-shaped shaping edge, before the electrically insulating layer 30 is then applied to the side areas of the multilayer structures 100 and to the first side wall regions 24. After this process step, the substrate wafer 200 is sawn from the side remote from the multilayer structures 100 along the separating tracks 201 using a saw blade with a V-shaped shaping edge, thereby producing the second beveled side wall regions 25 and also the side wall regions 27. This is followed by the severing of the substrate wafer 200 along the separating tracks 201, in particular by means of breaking or laser separation or by means of a further sawing cut, thereby producing the multiplicity of mutually separate semiconductor chips 1.

If the side wall regions 27 are not intended to be produced, then it is possible for this purpose either for the sawing cuts for producing the second oblique side wall regions 25 not to be made as deep, or for the substrate wafer 200 to be correspondingly thinned beforehand from its side remote from the multilayer structures 100, for example by means of grinding or etching.

The contacts 40 and 60 are produced at a suitable point in time depending on the exact sequence of the method.

The method principle described above can be employed in a form that is slightly modified according to the chip geometry respectively desired for the production of all the chip geometries of the embodiments described above (FIGS. 1 to 10).

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A radiation-emitting semiconductor chip, comprising:
   a multilayer structure containing a radiation-emitting active layer; and
   a window layer, which is transmissive to a radiation emitted by the radiation-emitting active layer and is arranged downstream of the multilayer structure with a first main area facing the multilayer structure;
   wherein the window layer has at least one peripheral side area having, in a direction away from the first main area toward a second main area remote from the multilayer structure, a first side area region which is beveled, curved or stepped such that the window layer widens with respect to a size of the first main area;
   wherein the peripheral side area of the multilayer structure and at least a part of the beveled, curved or stepped first side area region are coated with a continuous electrically insulating layer,
   wherein a beveled, curved or stepped second side area region is arranged downstream of the first side area region in a further direction toward the second main area, over a length of which the second side area region of the window layer tapers again, and wherein a peripheral protrusion is formed by the beveled, curved or stepped first and second side area regions of the window layer, which protrusion projects laterally beyond the first main area when viewed from the multilayer structure and projects laterally beyond the peripheral side area of the multilayer structure.

2. The radiation-emitting semiconductor chip as claimed in claim 1, wherein the window layer has, between the first side area region and the second side area region, a third side area region perpendicular to a main plane of the multilayer structure.

3. The radiation-emitting semiconductor chip as claimed in claim 2, wherein a fourth side area region perpendicular to a main plane of the multilayer structure is arranged downstream of the second side area region.

4. The radiation-emitting semiconductor chip as claimed in claim 3, wherein the first, second, third and fourth side area regions are all completely formed peripherally around the window layer.

5. The radiation-emitting chip as claimed in claim 3, wherein the fourth side area region is roughened.

6. The radiation-emitting chip as claimed in claim 2, wherein the third side area region is roughened.

7. The radiation-emitting semiconductor chip as claimed in claim 1, wherein the window layer is shaped from a growth substrate body utilized for an epitaxial growth of the multilayer structure.

8. The radiation-emitting semiconductor chip as claimed in claim 1, wherein the multilayer structure has, at its side remote from the window layer, a reflection layer for reflecting a radiation emitted by the radiation-emitting active layer toward the window layer.

9. The radiation-emitting semiconductor chip as claimed in claim 1, wherein a refractive index of material of the window layer is greater than the refractive index of the material of the multilayer structure adjoining the window layer.

10. The radiation-emitting semiconductor chip as claimed in claim 1, wherein the window layer comprises silicon carbide or is based on SiC and the multilayer structure is produced from nitride-based semiconductor materials.

11. The radiation-emitting semiconductor chip as claimed in claim 10, wherein the multilayer structure is produced from GaN-based semiconductor materials.

12. The radiation-emitting semiconductor chip as claimed in claim 1, wherein the second side area region has a planar oblique area which forms an angle ($\alpha$) with an axis perpendicular to a main plane of the radiation-emitting active layer, said angle lying between 20° and 70° inclusive.

13. The radiation-emitting semiconductor chip as claimed in claim 1, wherein at least the second side area region is roughened.

14. A radiation-emitting component having the radiation-emitting semiconductor chip as claimed in claim 1 and a component housing having a chip mounting area on which the semiconductor chip is mounted such that the multilayer structure faces toward the chip mounting area.

15. The radiation-emitting component as claimed in claim 14, wherein the semiconductor chip is fixed on the chip mounting area by one an electrically conductive adhesive and a metallic solder.

16. The radiation-emitting component as claimed in claim 14, wherein the component housing has a reflector well with oblique or parabolic side walls, in which the semiconductor chip is mounted.

17. The radiation-emitting component as claimed in claim 16, wherein the oblique or parabolic side walls of the reflector well are coated with reflection-increasing material.

18. A radiation-emitting semiconductor chip, comprising:
a multilayer structure containing a radiation-emitting active layer; and
a window layer, which is transmissive to a radiation emitted by the active layer and is arranged downstream of the multilayer structure with a first main area facing the multilayer structure,
wherein the semiconductor chip is provided for top-down mounting in a chip housing,
wherein the window layer has at least one peripheral side area having, in a direction from a first main area facing the multilayer structure toward a second main area remote from the multilayer structure a first side area region which is beveled, curved or stepped in such a way that the window layer widens with respect to the size of the first main area,
wherein the peripheral side area of the multilayer structure and at least a part of the beveled, curved or stepped first side area region are coated with a continuous electrically insulating layer,
wherein a beveled, curved or stepped second side area region is arranged downstream of the first side area region in a further direction toward the second main area, over a length of which the second side area region of the window layer tapers again, and
wherein a peripheral protrusion is formed by the beveled, curved or stepped first and second side area regions of the window layer, which protrusion projects laterally beyond the first main area when viewed from the multilayer structure and projects laterally beyond the peripheral side area of the multilayer structure.

19. A radiation-emitting semiconductor chip, comprising:
a multilayer structure containing a radiation-emitting active layer; and
a window layer, which is transmissive to a radiation emitted by the radiation-emitting active layer and is arranged downstream of the multilayer structure with a first main area facing the multilayer structure;
wherein the window layer has at least one side wall which extends, when viewed from the multilayer structure, in a direction away from the multilayer structure, over a first layer thickness section of the window layer, in an oblique, curved or stepped manner, away from a center axis of the semiconductor chip that is perpendicular to a growth plane of the radiation-emitting active layer,
wherein the at least one side wall extends, in a further direction away from the multilayer structure, over a second layer thickness section towards the center axis, and
wherein the at least one side wall has, at least over the first and second layer thickness sections, a peripheral protrusion which extends laterally beyond the first main area when viewed from the multilayer structure and projects laterally beyond a peripheral side area of the multilayer structure.

* * * * *

UNITED STATES PATENT AND TRADEMARK OFFICE
CERTIFICATE OF CORRECTION

| | | |
|---|---|---|
| PATENT NO. | : 7,446,344 B2 | Page 1 of 1 |
| APPLICATION NO. | : 10/491304 | |
| DATED | : November 4, 2008 | |
| INVENTOR(S) | : Michael Fehrer et al. | |

It is certified that error appears in the above-identified patent and that said Letters Patent is hereby corrected as shown below:

Column 13, at lines 60 to 63, please correct claim 15 as follows:

--15. The radiation-emitting component as claimed in claim 14, wherein the semiconductor chip is fixed on the chip mounting area by one of an electrically conductive adhesive and metallic solder.--

Signed and Sealed this
Twenty-fourth Day of May, 2011

David J. Kappos
*Director of the United States Patent and Trademark Office*